(12) United States Patent
Kurihara et al.

(10) Patent No.: US 11,440,303 B2
(45) Date of Patent: Sep. 13, 2022

(54) LAMINATE AND METHOD OF MANUFACTURING SAME

(71) Applicant: ZEON CORPORATION, Tokyo (JP)

(72) Inventors: Ryuta Kurihara, Tokyo (JP); Daido Chiba, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 23 days.

(21) Appl. No.: 16/639,585

(22) PCT Filed: Jun. 11, 2018

(86) PCT No.: PCT/JP2018/022181
§ 371 (c)(1),
(2) Date: Feb. 17, 2020

(87) PCT Pub. No.: WO2019/044108
PCT Pub. Date: Mar. 7, 2019

(65) Prior Publication Data
US 2020/0223198 A1 Jul. 16, 2020

(30) Foreign Application Priority Data

Aug. 30, 2017 (JP) .............................. JP2017-165160

(51) Int. Cl.
| | | |
|---|---|---|
| *B32B 27/30* | (2006.01) | |
| *B32B 27/32* | (2006.01) | |
| *B32B 38/18* | (2006.01) | |
| *C08L 53/02* | (2006.01) | |

(52) U.S. Cl.
CPC ............ *B32B 27/302* (2013.01); *B32B 27/32* (2013.01); *B32B 38/1858* (2013.01); *C08L 53/025* (2013.01); *B32B 2307/546* (2013.01); *B32B 2307/71* (2013.01); *B32B 2457/00* (2013.01)

(58) Field of Classification Search
None
See application file for complete search history.

(56) References Cited

U.S. PATENT DOCUMENTS 9,627,646 B2 4/2017 Ellinger et al.
2004/0260028 A1 12/2004 Sone
(Continued)

FOREIGN PATENT DOCUMENTS

EP 2623526 A1 8/2013
JP 2010074165 A 4/2010
(Continued)

OTHER PUBLICATIONS

Esneault—elastomers of fully hydrogenated styrene-diene block—Dev.Block Copolymers—2004 (Year: 2004).*
(Continued)

*Primary Examiner* — Callie E Shosho
*Assistant Examiner* — John Vincent Lawler
(74) *Attorney, Agent, or Firm* — Kenja IP Law PC

(57) ABSTRACT

Disclosed is a laminate which includes one or more soft layers and an electronic device enclosed by the one or more soft layers, wherein the one or more soft layers have a flexural modulus of 80 MPa or more and 1,000 MPa or less and a water vapor permeability at 40° C. and 90% RH of 15 [g/(m²·24 h)·100 μm] or less.

9 Claims, 1 Drawing Sheet

(56) References Cited

U.S. PATENT DOCUMENTS

| | | | |
|---|---|---|---|
| 2010/0068514 A1* | 3/2010 | Ellinger | C09J 153/025 428/351 |
| 2013/0008506 A1* | 1/2013 | Tanahashi | C08K 5/523 136/259 |
| 2013/0244367 A1* | 9/2013 | Kohara | B32B 27/365 438/64 |
| 2015/0307758 A1* | 10/2015 | Tazaki | C08L 53/025 257/40 |
| 2015/0329750 A1* | 11/2015 | Ishiguro | C08L 51/00 525/98 |
| 2016/0297956 A1* | 10/2016 | Sasaki | C08L 23/00 |
| 2016/0343970 A1 | 11/2016 | Tazaki et al. | |

FOREIGN PATENT DOCUMENTS

| | | | | |
|---|---|---|---|---|
| JP | 2013/038089 | * | 2/2013 | B32B 7/04 |
| JP | 2016036998 A | | 3/2016 | |
| TW | 201428048 A | | 7/2014 | |
| WO | 03018656 A1 | | 3/2003 | |
| WO | 2011068188 A1 | | 6/2011 | |
| WO | 2011096389 A1 | | 8/2011 | |
| WO | 2012043708 A1 | | 4/2012 | |
| WO | 2014091941 A1 | | 6/2014 | |
| WO | 2015099079 A1 | | 7/2015 | |
| WO | WO-2015099079 A1 | * | 7/2015 | B32B 7/04 |
| WO | 2016153030 A1 | | 9/2016 | |

OTHER PUBLICATIONS

AWWA Manual—Chap.1—Eng.Prop. of PE—2005 (Year: 2005).*
Komiyama—JP 2013-038089 A—sister of Euro D#3—M—sealing material—UV absorber—2013 (Year: 2013).*
Tazaki—WO 2015-099079 A1—Euro D#2—MT—sealing film EL display—TG motive & transmittance & UV absorb—2015 (Year: 2015).*
Keller—water vapor permeability in plastics—PNNL—26070-2017 (Year: 2017).*
Polymer Science Learning Center—Thermoplastics Polyethylene—soft—Jul. 2021 (Year: 2021).*
Ultraviolet radiation—Britannica Online Encyclopedia—Jul. 13, 2021 (Year: 2021).*
Mar. 3, 2020, International Preliminary Reporton Patentability issued in the International Patent Application No. PCT/JP2018/022181.
Mar. 19, 2021, the Extended European Search Report issued by the European Patent Office in the corresponding European Patent Application No. 18851704.9.
Nov. 25, 2021, Communication pursuant to Article 94(3) EPC issued by the European Patent Office in the corresponding European Patent Application No. 18851704.9.

* cited by examiner

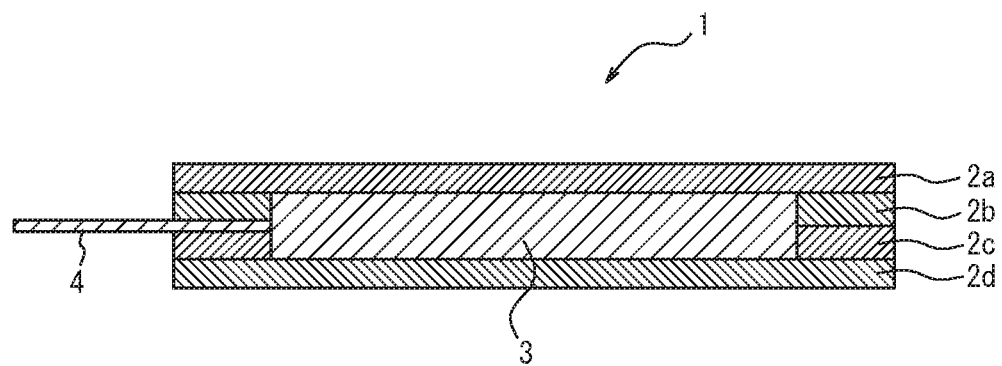

LAMINATE AND METHOD OF MANUFACTURING SAME

TECHNICAL FIELD

The present disclosure relates laminates and methods of manufacturing the same.

BACKGROUND

Apparatuses which use electronic devices such as organic electroluminescence elements (hereinafter also referred to as "organic EL elements") have heretofore been made thinner and more flexible. Thus, the development of various apparatuses with excellent flexibility with the use of electronic devices has been in progress.

Electronic devices include organic materials that are susceptible to damage by water and air. Therefore, in apparatuses which include electronic devices, it is common to seal the electronic devices in order to protect the organic material from water and air (see, e.g., PTL 1).

CITATION LIST

Patent Literature

PTL 1: WO2016153030

SUMMARY

Technical Problem

However, the apparatus having electronic devices as described in PTL 1 may not have sufficient moisture resistance because it employs a close-sealing structure in which a sealing agent fills in between a substrate having electronic devices formed on the surface and a barrier member and the sealing agent is disposed only on one side of each electronic device.

An object of the present disclosure is therefore to provide a laminate having an electronic device, which is excellent in flexibility and moisture resistance.

Another object of the present disclosure is to provide a method of manufacturing a laminate, the method being capable of manufacturing a laminate having an electronic device, which is excellent in flexibility and moisture resistance.

Solution to Problem

The inventor made extensive studies to achieve the objects set forth above. The inventor has established that a laminate having an electronic device, which is excellent in flexibility and moisture resistance, can be obtained when the laminate includes: a soft layer having a flexural modulus and a water vapor permeability in specific ranges; and an electronic device enclosed by the soft layer.

Specifically, the present disclosure aims to advantageously solve the problem set forth above, and a disclosed laminate is a laminate which comprises one or more soft layers and an electronic device enclosed by the one or more soft layers, wherein the one or more soft layers have a flexural modulus of 80 MPa or more and 1,000 MPa or less and a water vapor permeability at 40° C. and 90% RH of 15 [g/(m$^2$·24 h)·100 μm] or less. When an electronic device is enclosed by a soft layer having a flexural modulus and a water vapor permeability in specific ranges as described above, it is possible to obtain a laminate having an electronic device, which is excellent in flexibility and moisture resistance.

The term "enclose" as used herein encompasses not only an embodiment wherein the soft layer completely encloses the electronic device, but also an embodiment wherein the electronic device has a portion not directly enclosed by the soft layer, e.g., a portion from which a lead-out wire (cable) connected to the electronic device is taken out.

The term "soft layer" as used herein refers to a layer for enclosing an electronic device. When the soft layer comprises two or more soft layers, every soft layer contacts the electronic device.

In the disclosed laminate, it is preferred that the one or more soft layers comprise two or more soft layers. When the one or more soft layers comprise two or more soft layers, the electronic device can be easily enclosed.

In the disclosed laminate, it is preferred that the soft layer positioned on one side of the electronic device and the soft layer positioned on the other side of the electronic device are different soft layers. When the soft layer positioned on one side of the electronic device and the soft layer position on the other side of the electronic device are different, the different soft layers can be disposed at appropriate positions, so that the function of the laminate can be improved.

The term "different" as used herein for the soft layers means that the soft layers are different in at least one of thickness, material, and color, for example.

In the disclosed laminate, it is preferred that at least one of the one or more soft layers comprises a thermoplastic resin. When at least one of the one or more soft layers comprises a thermoplastic resin, the flexibility of the laminate can be further improved.

In the disclosed laminate, it is preferred that the thermoplastic resin has a glass transition temperature or melting point of 90° C. or higher. When the thermoplastic resin has a glass transition temperature or melting point of 90° C. or higher, the laminate can withstand the heat generated from the electronic device.

In the disclosed laminate, it is preferred that the thermoplastic resin comprises as a main component a modified hydrogenated block copolymer [E] in which an alkoxysilyl group is introduced to a hydrogenated block copolymer [D], the hydrogenated block copolymer [D] being obtained by hydrogenating a block copolymer [C] which comprises: a polymer block [A] which comprises as a main component a structural unit derived from an aromatic vinyl compound; and a polymer block [B] which comprises as a main component a structural unit derived from a chain conjugated diene compound (linear or branched conjugated diene). When the thermoplastic resin comprises such a modified hydrogenated block copolymer [E] as a main component, the flexibility of the laminate can be further improved.

The term "polymer block [A] which comprises as a main component a structural unit derived from an aromatic vinyl compound" as used herein means a "polymer block [A] which comprises more than 50% by mass of a structural unit derived from an aromatic vinyl compound" and the term "polymer block [B] which comprises as a main component a structural unit derived from a chain conjugated diene compound" as used herein means a "polymer block [B] which comprises more than 50% by mass of a structural unit derived from a chain conjugated diene compound."

In the disclosed laminate, it is preferred that the thermoplastic resin comprises as a main component a modified hydrogenated block copolymer [E] in which an alkoxysilyl group is introduced to a hydrogenated block copolymer [D], the hydrogenated block copolymer [D] being obtained by hydrogenating 90% or more of carbon-carbon unsaturated bonds of main chains and side chains and 90% or more of carbon-carbon unsaturated bonds of aromatic rings in a block copolymer [C] which comprises: a polymer block [A] which comprises as a main component a structural unit derived from an aromatic vinyl compound; and a polymer block [B] which comprises as a main component a structural unit derived from a chain conjugated diene compound. When the thermoplastic resin comprises such a modified hydrogenated block copolymer [E] as a main component, the flexibility of the laminate can be further improved.

In the disclosed laminate, it is preferred that at least one of the one or more soft layers comprises an ultraviolet absorber. When at least one of the one or more soft layers comprises an ultraviolet absorber, it is possible to prevent the degradation of the laminate by ultraviolet light.

In the disclosed laminate, it is preferred that at least one of the one or more soft layers has a total light transmittance of 85% or more and a spectral light transmittance at 385 nm wavelength or less of 1% or less. When at least one of the one or more soft layers has a total light transmittance of 85% or more and a spectral light transmittance at 385 nm wavelength or less of 1% or less, the transparency and weather resistance of the laminate can be improved.

The present disclosure aims to advantageously solve the problem set forth above, and a disclosed method of manufacturing a laminate is a method of manufacturing any one of the laminates described above, and the disclosed method comprises: vacuum degassing a package in which a stack is sealed in a packaging bag; and making a laminate by heating and pressurizing the package subjected to the vacuum degassing, wherein a relation of $T4 > T1 \geq T2 \geq T3$ is satisfied, where T1 is a temperature of the heating, T2 is a glass transition temperature or melting point of the one or more soft layers, T3 is a Vicat softening temperature of the packaging bag, and T4 is a melting temperature of the packaging bag. When the temperatures T1 to T4 satisfy the relation $T4 > T1 \geq T2 \geq T3$, it is possible to manufacture a laminate excellent in flexibility and moisture resistance.

The term "stack" as used herein means a "stack including a soft layer and an electronic device before subjected to heating and pressurizing (e.g., before subjected to autoclaving)". The term "packaging bag" as used herein means a "bag for enclosing a stack therein." The term "package" as used herein means a "packaging bag containing a stack therein." The term "laminate" as used herein means a "product taken out from the packaging bag of a package subjected to heating and pressurizing."

"Temperature T1 of heating" as used herein means a maximum temperature from the start to the end of lamination. "Glass transition temperature or melting point T2 of the soft layer" means, when the soft layer comprises two or more soft layers and the material (thermoplastic resin) of each layer is not the same, the highest temperature among the glass transition temperatures or melting points of the different materials (thermoplastic resins) of the soft layers, and means, when the material of the soft layer has a plurality of glass transition temperatures or melting points, the highest glass transition temperature or melting point. "Vicat softening temperature T3 of the packaging bag" means, when the packaging bag comprises a plurality of layers, the Vicat softening temperature of the material of the innermost layer of the packaging bag. "Melting temperature T4 of the packaging bag" means, when the packaging bag comprises a plurality of layers, the melting temperature of the material of the innermost layer of the packaging bag.

In the disclosed method of manufacturing a laminate, it is preferred that the packaging bag comprises one or more layers made of polyethylene resin. When the packaging bag comprises one or more layers made of polyethylene resin, it is possible to more reliably manufacture a laminate which is excellent in flexibility and moisture resistance.

Advantageous Effect

According to the disclosed laminate, it is possible to increase flexibility and moisture resistance.

According to the disclosed method of manufacturing a laminate, it is possible to manufacture a laminate having an electronic device, which is excellent in flexibility and moisture resistance.

BRIEF DESCRIPTION OF THE DRAWINGS

In the accompanying drawings:

FIG. 1 is a cross-sectional view of an exemplary embodiment of the disclosed laminate.

DETAILED DESCRIPTION

The following provides a detailed description of an embodiment of the present disclosure.

The disclosed laminate is used, for example, as a display device, a light emitting device or the like. The disclosed method of manufacturing a laminate can manufacture a laminate which is used, for example, as a display device, a light emitting device or the like.

(Laminate)

The disclosed laminate is a laminate which comprises: two or more soft layers having a flexural modulus and a water vapor permeability in specific ranges; an electronic device enclosed by the two or more soft layers; and other optional layer(s).

Referring to FIG. 1, an example of the disclosed laminate will be described.

FIG. 1 is a cross-sectional view of an exemplary embodiment of the disclosed laminate. In FIG. 1, 1 denotes a laminate, 2a, 2b, 2c and 2d denote a soft layer, 3 denotes an electronic device, and 4 denotes a lead-out wire. As depicted in FIG. 1, the electronic device 3 is enclosed by four soft layers 2a, 2b, 2c, 2d. In FIG. 1, 2b, 2c denote a frame-shaped soft layer in which space for inserting the electronic device 3 inside is formed.

Although a laminate including four soft layers is depicted in FIG. 1, the disclosed laminate is not limited to this particular laminate.

In order to improve thermal diffusivity and design characteristics, for example, the laminate may further include a metal layer such as aluminum foil or the like as an optional other layer on the surface of the soft layer 2d disposed on the back side of the laminate 1, or a metallic filler may be added into the soft layer 2d disposed on the back side of the laminate 1.

Further, in order to improve the resistance against heat generated from the electronic device 3, for example, it is preferred that the soft layers which contact the electronic device 3 (all the soft layers 2a to 2d in FIG. 1) comprise a resin having excellent heat resistance.

<Soft Layer>

The soft layer has a flexural modulus and a water vapor permeability in specific ranges. With this configuration, it is possible to increase the flexibility and moisture resistance of the laminate.

When the soft layer for enclosing the electronic device comprises two or more soft layers, all the soft layers are layers contacting the electronic device and all have a flexural modulus and a water vapor permeability in specific ranges. In other words, the layer formed on the outer side the soft layer and not contacting the electronic device may or may not have a flexural modulus and a water vapor permeability in specific ranges.

In the disclosed laminate, an electronic device described later is enclosed by the soft layer.

The form in which the electronic device is enclosed is not limited to a particular form. However, from the viewpoint of easiness of enclosing, it is preferred that the electronic device is enclosed by two or more soft layers.

When the soft layer comprises two or more layers, from the viewpoint of improving the function of the laminate, it is preferred that the soft layer positioned on one side of the electronic device and the soft layer position on the other side of the electronic device are different soft layers.

The thickness of the soft layer is not limited to a particular value and is preferably 0.01 mm or more, more preferably 0.05 mm or more, and particularly preferably 0.1 mm or more, but preferably 5 mm or less, more preferably 4 mm or less, and particularly preferably 3 mm or less. By setting the thickness of the soft layer to fall within the preferred range, it is possible to manufacture a laminate having an excellent ability of enclosing an electronic device.

In addition, from the viewpoint of protecting the electronic device, it is preferred that the thickness of the soft layer is at least 1.0 time the thickness of the electronic device, which is described later.

The soft layer may have, in a tiny scale, a structure with irregular thickness by having irregular patterns, embossed features, steps, grooves and/or the like formed on the surface of the sheet.

Methods of making the soft layer are not limited to particular ones and examples thereof include melt extrusion, inflation molding, and calendar molding. Preferred is melt extrusion from the viewpoint of easiness of providing embossed features on the surface of the soft layer.

The surface of the soft layer can have a flat, embossed or other shape. In order to prevent blocking of the soft layers during storage, a release film can be placed on one side of each soft layer.

<<Flexural Modulus>>>

The flexural modulus of the soft layer is 80 MPa or more, preferably 100 MPa or more, more preferably 150 MPa or more, and particularly preferably 240 MPa or more, but 1,000 MPa or less, preferably 900 MPa or less, more preferably 800 MPa or less, and particularly preferably 700 MPa or less.

At a flexural modulus of 80 MPa or more, it is possible to manufacture a laminate having good handleability. At a flexural modulus of 1,000 MPa or less, it is possible to improve the flexibility of the laminate. By setting the flexural modulus to fall within the more preferred range, it is possible to reliably manufacture a laminate having both handleability and flexibility.

"Flexural modulus" can be measured by manufacturing a test piece having a length of 80 mm, a width of 10 mm and a thickness of 4 mm by injection molding and performing a flexural test in accordance with JIS K 7171.

<<Water Vapor Permeability>>>

The water vapor permeability at 40° C. and 90% RH of the soft layer is 15 [g/(m$^2$·24 h)·100 μm] or less, preferably 14 [g/(m$^2$·24 h)·100 μm] or less, more preferably 13 [g/(m$^2$·24 h)·100 μm] or less, and particularly preferably 12 [g/(m$^2$·24 h)·100 μm] or less.

At a water vapor permeability at 40° C. and 90% RH of 15 g/(m$^2$·24 h·100 μm) or less, it is possible to increase the moisture resistance of the laminate. "Water vapor permeability" can be measured using a water vapor permeability tester (Lyssy L80-5000) at 40° C. and 90% RH in accordance with JIS K7129 (method A).

At least one of the one or more soft layers preferably comprises a thermoplastic resin and also preferably comprises an ultraviolet absorber. When at least one of the one or more soft layers comprises a thermoplastic resin, it is possible to further improve the flexibility of the laminate. When at least one of the one or more soft layers comprises an ultraviolet absorber, it is possible to prevent degradation of the laminate by ultraviolet light.

More preferably, all of the soft layers comprise a thermoplastic resin, so that the electronic device can be easily removed by heating for recycling.

<<Thermoplastic Resin>>>

Examples of thermoplastic resins include block copolymers produced from aromatic vinyl compounds and conjugated diene compounds, and hydrogenated products thereof; block copolymers produced from aromatic vinyl compounds and isobutene or isobutene derivatives, and hydrogenated products thereof; polyolefin resins such as polyethylene, polypropylene, poly-1-butene, poly-4-methylpentene, ethylene/propylene copolymers, ethylene/1-butene copolymers, ethylene/4-methylpentene copolymers, ethylene/1-octene copolymers, ethylene/1-butene/1-octene copolymers, ethylene/propylene/dicyclopentadiene copolymers, ethylene/propylene/5-ethylidene-2-norbornene copolymers, ethylene/propylene/5-vinyl-2-norbornene copolymers, ethylene/1-butene/dicyclopentadiene copolymers, ethylene/1-butene/5-ethylidene-2-norbornene copolymers, and ethylene/1-butene/vinyl norbornene copolymers; cycloolefin polymers such as ethylene/norbornene copolymers, ethylene/tetracyclododecene copolymers, hydrogenated ring-opened metathesis polymers of norbornene derivatives, and cyclohexadiene polymers; olefin/(meth)acrylate copolymers such as ethylene/(meth)acrylate copolymers such as ethylene/methyl methacrylate copolymers, ethylene/ethyl methacrylate copolymers, ethylene/methyl acrylate copolymers, and ethylene/ethyl acrylate copolymers; ionomer resins obtained by reacting ethylene/unsaturated carboxylic acid random copolymers with metal compounds; polyester resins such as polyethylene terephthalate, polybutylene terephthalate, polyethylene naphthalate, and polycyclohexane dimethylene terephthalate; polycarbonate resins obtained by reacting bisphenols (e.g., bisphenol A, 4,4'-dihydroxybiphenyl, bis(4-hydroxyphenyl)methane, 1,1-bis(4-hydroxyphenyl)ethane, 1,1-bis(4-hydroxyphenyl)phenylethane, 2,2-bis(3-methyl-4-hydroxyphenyl)propane, 1,1-bis(4-hydroxyphenyl)cyclohexane, 2,2-bis(3-phenyl-4-hydroxyphenyl)propane, 2,2-bis (3-isopropyl-4-hydroxyphenyl)propane, 2,2-bis(4-hydroxyphenyl)butane, 2,2-bis(3,5-dimethyl-4-hydroxyphenyl)propane, 2,2-bis(3,5-dibromo-4-hydroxyphenyl)propane, 4,4'-dihydroxydiphenyl sulfone, 4,4'-dihydroxydiphenyl sulfoxide, 4,4'-dihydroxydiphenyl sulfide, 3,3'-dimethyl-4,4'-dihydroxydiphenyl sulfide, 4,4'-dihydroxydiphenyl oxide, and 9,9-bis(4-hydroxyphenyl)fluorene) with carbonyl compounds such as carbonyl chloride; styrene resins such as polystyrene, styrene/methyl methacrylate copolymers, and styrene/acrylonitrile copolymers; (meth)acrylate (co)polymers such as polymethyl methacrylate, polymethyl acrylate, methyl methacrylate/glycidyl methacrylate copolymers, and methyl methacrylate/tricyclodecyl methacrylate copolymers; ethylene/vinyl acetate copolymers; halogen-containing resins such as polyvinyl chloride, polyvinylidene chloride, polyvinyl fluoride, polyvinylidene fluoride, and ethylene/tetrafluoroethylene copolymers; polyurethane resins; aromatic resins such as polyetheretherketone, polysulfone, polyethersulfone, polyarylate, and polyetherimide; polyamide resins such as nylon 6, nylon 66, nylon 11, nylon 12, and nylon 6T; and modified thermoplastic resins obtained by introducing an alkoxysilyl group or an acid anhydride group into the foregoing thermoplastic resins.

Among the foregoing thermoplastic resins, preferred are (i) block copolymers produced from aromatic vinyl compounds and conjugated diene compounds, and hydrogenated products thereof; (ii) more preferred is a hydrogenated block copolymer [D] obtained by hydrogenating a block copolymer [C] which comprises: a polymer block [A] which comprises as a main component a structural unit derived from an aromatic vinyl compound; and a polymer block [B] which comprises as a main component a structural unit derived from a chain conjugated diene compound (linear or branched conjugated diene); (iii) even more preferred is a hydrogenated block copolymer [D] obtained by hydrogenating 90% or more of carbon-carbon unsaturated bonds of main chains and side chains and 90% or more of carbon-carbon unsaturated bonds of aromatic rings in a block copolymer [C] which comprises: a polymer block [A] which comprises as a main component a structural unit derived from an aromatic vinyl compound; and a polymer block [B] which comprises as a main component a structural unit derived from a chain conjugated diene compound: (iv) particularly preferred is a modified hydrogenated block copolymer [E] in which an alkoxysilyl group is introduced to a hydrogenated block copolymer [D] obtained by hydrogenating a block copolymer [C] which comprises: a polymer block [A] which comprises as a main component a structural unit derived from an aromatic vinyl compound; and a polymer block [B] which comprises as a main component a structural unit derived from a chain conjugated diene compound; and (v) most preferred is a modified hydrogenated block copolymer [E] in which an alkoxysilyl group is introduced to a hydrogenated block copolymer [D] obtained by hydrogenating 90% or more of carbon-carbon unsaturated bonds of main chains and side chains and 90% or more of carbon-carbon unsaturated bonds of aromatic rings in a block copolymer [C] which comprises: a polymer block [A] which comprises as a main component a structural unit derived from an aromatic vinyl compound; and a polymer block [B] which comprises as a main component a structural unit derived from a chain conjugated diene compound.

The thermoplastic resin is preferably soluble in solvent. By dissolving the thermoplastic resin contained in at least one of the one or more soft layers in solvent, the electronic device is exposed and can be easily removed for recycling.

<<<<Modified Hydrogenated Block Copolymer [E]>>>

The modified hydrogenated block copolymer [E] is a polymer in which an alkoxysilyl group is introduced to the precursor hydrogenated block copolymer [D].

Hydrogenated Block Copolymer [D]

The specific hydrogenated block copolymer [D] used herein is a polymer obtained by hydrogenating the precursor block copolymer [C] and more specifically is a polymer obtained by hydrogenating the block copolymer [C] which is a polymer having a polymer block [A] which comprises as a main component a structural unit derived from an aromatic vinyl compound, and a polymer block [B] which comprises as a main component a structural unit derived from a chain conjugated diene compound.

In the hydrogenated block copolymer [D], preferably 90% or more, more preferably 97% or more, and particularly 99% or more of carbon-carbon unsaturated bonds of main chains and side chains are hydrogenated, and preferably 90% or more, more preferably 97% or more, and particularly preferably 99% or more of carbon-carbon unsaturated bonds of aromatic rings are hydrogenated. Note that "hydrogenation of carbon-carbon unsaturated bonds of main chains and side chains" means "hydrogenation of double bonds derived from the chain conjugated diene compound in the block copolymer [C]" and "hydrogenation of carbon-carbon unsaturated bonds of aromatic rings" means "hydrogenation of double bonds derived from the aromatic rings in the block copolymer [C]."

A higher value of percent hydrogenation which indicates the degree of hydrogenation means better light resistance, heat resistance and transparency of the soft layer.

The percent hydrogenation of the hydrogenated block copolymer [D] can be determined for example by measuring 1H-NMR of the block copolymer [C] and the hydrogenated block copolymer [D].

Methods of hydrogenating carbon-carbon unsaturated bonds, reaction mode and other conditions are not limited to particular ones and hydrogenation can be effected in accordance with any methods known in the art. However, hydrogenation methods that entail less polymer chain-scission reaction are preferred in view of increasing percent hydrogenation. Examples of hydrogenation methods with less polymer chain scission reaction include those described for example in WO2011/096389 and WO2012/043708.

After completion of the hydrogenation reaction, the hydrogenation catalyst and/or polymerization catalyst are removed from the reaction solution and then the hydrogenated block copolymer [D] can be recovered from the reaction solution. The form of the recovered hydrogenated block copolymer [D] is not limited to a particular one, but it is preferably processed in pellet form for subsequent reaction for introducing an alkoxysilyl group.

The molecular weight of the hydrogenated block copolymer [D] is not limited to a particular value. From the viewpoint of heat resistance and mechanical strength of the soft layer, however, the molecular weight is preferably 35,000 or more, more preferably 38,000 or more, particularly preferably 40,000 or more, but preferably 200,000 or less, more preferably 150,000 or less, and particularly preferably 100,000 or less, in terms of polystyrene equivalent weight-average molecular weight (Mw) as measured by gel-permeation chromatography (GPC) using THF as solvent.

The molecular weight distribution (Mw/Mn) of the hydrogenated block copolymer [D] is not limited to a particular value but is preferably 3 or less, more preferably 2 or less, and particularly preferably 1.5 or less, from the viewpoint of heat resistance and mechanical strength of the soft layer.

Block Copolymer[C]

The block copolymer [C] is a polymer having one or more polymer blocks [A] which comprise as a main component a structural unit derived from an aromatic vinyl compound, and one or more polymer blocks [B] which comprises as a main component a structural unit derived from a chain conjugated diene compound. Preferably, the block copolymer [C] is a polymer which comprises two or more polymer blocks [A] and one or more polymer blocks [B].

The number of the polymer block [A] in the block copolymer [C] is preferably 3 or less, and more preferably 2.

The number of the polymer block [B] in the block copolymer [C] is preferably 2 or less, and more preferably 1.

By setting the numbers of the polymer block [A] and the polymer block [B] in the block copolymer [C] to fall within the respective ranges described above, it is possible to prevent the phase separation between the hydrogenation polymer block derived from the polymer block [A] (hereinafter also referred to as "hydrogenated polymer block [Ah]") and the hydrogenated polymer block derived from the polymer block [B] from becoming unclear in the hydrogenated block copolymer [D] which is obtained by hydrogenating the block copolymer [C], thereby preventing reductions in the glass transition temperature at higher temperatures based on the hydrogenated polymer block [Ah] (hereinafter also referred to as "Tg2") and thus preventing reductions in the heat resistance of the resulting soft layer.

The glass transition temperature at higher temperatures Tg2 of the hydrogenated block copolymer [D] is not limited to a particular value but is preferably 90° C. to 125° C.

The block of the block copolymer [C] takes any form and may be a chain or radial block, but preferably is a chain block from the viewpoint of mechanical strength. A particularly preferred form of the block copolymer [C] is an A-B-A triblock copolymer which comprises the polymer blocks [A] bound to both ends of the polymer block [B].

When the mass fraction of all the polymer blocks [A] in the block copolymer [C] is defined as wA and the mass fraction of all the polymer blocks [B] in the block copolymer [C] is defined as wB, the ratio of wA to wB (wA:wB) is preferably 30:70 to 60:40, more preferably 35:65 to 55:45, and particularly preferably 40:60 to 50:50.

Also, the ratio between the mass fraction of all the structural units derived from an aromatic vinyl compound in the copolymer block [C] and the mass fraction of all the structural units derived from a chain conjugated diene compound in the copolymer block [C] is preferably 30:70 to 60:40, more preferably 35:65 to 55:45, and particularly preferably 40:60 to 50:50.

By setting the mass fraction wA to 60% or less, it is possible to prevent reduction in the softness (flexibility) of the resulting soft layer. On the other hand, By setting the mass fraction wA to 30% or more, it is possible to prevent reduction in the heat resistance of the soft layer.

The molecular weight of the block copolymer [C] is not limited to a particular value, but from the viewpoint of heat resistance and mechanical strength of the soft layer, the molecular weight is preferably 35,000 or more, more preferably 38,000 or more, and particularly preferably 40,000 or more, but preferably 200,000 or less, more preferably 150,000 or less, and particularly preferably 100,000 or less, in terms of polystyrene equivalent weight average molecular weight (Mw) as measured by gel permeation chromatography (GPC) using tetrahydrofuran (THF) as solvent.

The molecular weight distribution (Mw/Mn) of the block copolymer [C] is not limited to a particular value, but from the viewpoint of heat resistance and mechanical strength of the soft layer, it is preferably 3 or less, more preferably 2 or less, and particularly preferably 1.5 or less.

The block copolymer [C] can be produced by any methods known in the art. Exemplary production methods include those described for example in WO2003018656A and WO2011096389A.

[Polymer Block [A]]

The polymer block [A] is a polymer block which comprises as a main component a structural unit [a] derived from an aromatic vinyl compound. The amount of the structural unit [a] in the polymer block [A] is preferably 90% by mass or more, more preferably 95% by mass or more, and particularly preferably 99% by mass or more.

When the amount of the structural unit [a] in the polymer block [A] is 90% by mass or more, it is possible to prevent reduction in the heat resistance of the resulting soft layer.

The polymer block [A] may comprise components other than the structural unit [a]. Examples of other components include a structural unit [b] derived from a chain conjugated diene described later and/or a structural unit [j] derived from other vinyl compound. The total amount of the structural unit [b] derived from a chain conjugated diene and the structural unit [j] derived from other vinyl compound in the polymer block [A] is preferably 10% by mass or less, more preferably 5% by mass or less, and particularly preferably 1% by mass or less.

When the polymer block [A] comprises the structural unit [b] and/or structural unit [j] which are structural units other than the structural unit [a], it is usually preferred that the polymer block [A] has a portion where the structural units [a], [b] and [j] are irregularly repeated.

When the total amount of the structural units [b] and [j] in the polymer block [A] is 10% by mass or less, it is possible to prevent reduction in the heat resistance of the resulting soft layer.

When the block copolymer [C] has a plurality of polymer blocks [A], each polymer block [A] may be the same or different.

[[Aromatic Vinyl Compound]]

Examples of aromatic vinyl compounds include styrene; styrenes having a C1-C6 alkyl group as a substituent, such as a-methylstyrene, 2-methylstyrene, 3-methylstyrene, 4-methylstyrene, 2,4-diisopropylstyrene, 2,4-dimethylstyrene, 4-t-butyl styrene, and 5-t-butyl-2-methylstyrene; styrenes having a C1-C6 alkoxy group as a substituent, such as 4-methoxystyrene; styrenes having an aryl group as a substituent, such as 4-phenylstyrene; and vinylnaphthalenes such as 1-vinylnaphthalene and 2-vinylnaphthalene. These aromatic vinyl compounds may be used singly or in combination.

Preferred from the viewpoint of low moisture absorbency are polar group-free aromatic vinyl compounds such as styrenes having a C1-C6 alkyl group as a substituent, with styrene being more preferred for its industrial availability.

[[Other Vinyl Compound]]

Examples of other vinyl compounds include vinyl compounds other than aromatic vinyl compounds and chain conjugated diene compounds, such as chain vinyl compounds, cyclic vinyl compounds, unsaturated cyclic acid anhydrides, and unsaturated imide compounds. These compounds may have substituent(s) such as nitrile group, alkoxycarbonyl group, hydroxycarbonyl group, and halogens. These vinyl compounds may be used singly or in combination.

Preferred from the viewpoint of low moisture absorbency are C2-20 chain vinyl compounds (chain olefins) such as ethylene, propylene, 1-butene, 1-pentene, 1-hexene, 1-heptene, 1-octene, 1-nonene, 1-decene, 1-dodecene, 1-eicosene, 4-methyl-1-pentene, and 4,6-dimethyl-1-heptene; C5-C20 cyclic vinyl compounds (cyclic olefins) such as vinylcyclohexane and norbornene; and cyclic diene compounds such as 1,3-cyclohexadiene and norbornadiene, all of which do not have a polar group.

[Polymer Block [B]]

The polymer block [B] is a polymer block which comprises as a main component a structural unit [b] derived from a chain conjugated diene compound. The amount of the structural unit [b] in the polymer block [B] is preferably 70% by mass or more, more preferably 80% by mass or more, and particularly preferably 90% by mass or more.

The amount of the structural unit [b] in the polymer block [B] is preferably 70% by mass or more because the resulting soft layer has softness (flexibility).

The polymer block [B] may comprise components other than the structural unit [b]. Examples of other components include the structural unit [a] derived from an aromatic vinyl compound described above and/or the structural unit [j] derived from other vinyl compound described above. The total amount of the structural unit structural unit [a] derived from an aromatic vinyl compound and the structural unit [j] derived from other vinyl compound in the polymer block [B] is preferably 30% by mass or less, more preferably 20% by mass or less, and particularly preferably 10% by mass or less.

When the polymer block [B] comprises the structural unit [a] and/or structural unit [j] which are structural units other than the structural unit [b], it is usually preferred that the polymer block [B] has a portion where the structural units [a], [b] and [j] are irregularly repeated.

When the total amount of the structural unit [a] and structural unit [j] in the polymer block [B] is 30% by mass or less, it is possible to prevent the softness (flexibility) of the resulting soft layer from being impaired.

When the block copolymer [C] has a plurality of polymer blocks [B], each polymer block [B] may be the same or different.

In the polymer block [B], some of the structural units [b] derived from a chain conjugated diene compound may have structural units polymerized by 1,2-and/or 3,4-bonds (structural units derived from 1,2-and/or 3,4-addition polymerization) and the remainder of the structural units [b] may have structural units polymerized by 1,4-bonds (structural units derived from 1,4-addition polymerization).

A polymer block [B] which comprises structural units derived from a chain conjugated diene compound which are polymerized by 1,2-and/or 3,4-bonds can be obtained by polymerizing a chain conjugated diene compound, and optionally an aromatic vinyl compound and/or other vinyl compound, in the presence of a specific compound having an electron-donating atom as a randomizing agent. The amount of structural units derived from a chain conjugated diene compound which are polymerized by 1,2-and/or 3,4-bonds can be controlled by the amount of the randomizing agent added.

Examples of compounds having an electron-donating atom (e.g., oxygen (O), nitrogen (N)) include ether compounds, amine compounds, and phosphine compounds. Preferred are ether compounds from the viewpoint that the molecular weight distribution of the random copolymer block can be narrowed and hydrogenation reactions are not easily inhibited.

Specific examples of compounds having an electron-donating atom include diethyl ether, diisopropyl ether, dibutyl ether, tetrahydrofuran, ethylene glycol dimethyl ether, ethylene glycol diethyl ether, ethylene glycol diisopropyl ether, ethylene glycol dibutyl ether, ethylene glycol methyl phenyl ether, propylene glycol dimethyl ether, propylene glycol diethyl ether, propylene glycol diisopropyl ether, propylene glycol dibutyl ether, di(2-tetrahydrofuryl)methane, diethylene glycol dibutyl ether, dipropylene glycol dibutyl ether, and tetramethylethylenediamine. The amount of the compounds having an electron-donating atom is preferably 0.001 parts by mass or more, and more preferably 0.01 parts by mass or more, but preferably 10 parts by mass or less, and more preferably 1 part by mass or less, per 100 parts by mass of the chain conjugated diene compound.

Examples of chain conjugated diene compounds include 1,3-butadiene, isoprene, 2,3-dimethyl-1,3-butadiene, 1,3-pentadiene, and chloroprene. These compounds may be used singly or in combination.

Preferred from the viewpoint of low moisture absorbency are chain conjugated diene compounds which do not have a polar group, with 1,3-butadiene and isoprene being more preferred for their industrial availability.

Modified Hydrogenated Block Copolymer [E]

The modified hydrogenated block copolymer [E] is a polymer in which an alkoxysilyl group is introduced to the hydrogenated bock copolymer [D].

Introduction of an alkoxysilyl group into the hydrogenated block copolymer [D] provides the modified hydrogenated block copolymer [E] with strong adhesion to the electronic device.

Alkoxysilyl Group

Examples of alkoxysilyl groups to be introduced include tri(C1-C6 alkoxy)silyl group such as trimethoxysilyl group and triethoxysilyl group; (C1-C20 alkyl)di(C1-C6 alkoxy)silyl group such as methyldimethoxysilyl group, methyldiethoxysilyl group, ethyldimethoxysilyl group, ethyldiethoxysilyl group, propyldimethoxysilyl group, and propyldiethoxysilyl group; and (aryl)di(C1-C6 alkoxy)silyl group such as phenyldimethoxysilyl group and phenyldiethoxysilyl group.

The alkoxysilyl group may be bound to the hydrogenated block copolymer [D] via a divalent organic group such as C1-C20 alkylene group or C2-C20 alkyl eneoxycarbonylalkylene group.

[Amount of Alkoxysilyl Group Introduced]

The amount of the alkoxysilyl group introduced per 100 parts by mass of the hydrogenated block copolymer [D] is not limited to a particular value, but is preferably 0.1 parts by mass or more, more preferably 0.2 parts by mass or more, and particularly preferably 0.3 parts by mass or more, but preferably 10 parts by mass or less, more preferably 5 parts by mass or less, and particularly preferably 3 parts by mass or less.

When the amount of the alkoxysilyl group introduced is 10 parts by mass or less, it is possible to prevent the promotion of crosslinking of alkoxysilyl groups which have been decomposed by trace amounts of moisture or the like before the obtained modified hydrogenated block copolymer [E] is molten and shaped into a sheet, so that the gelation of the modified hydrogenated block copolymer [E] or reduction in the formability due to reduced fluidity at the time of melting can be prevented. When the amount of the alkoxysilyl group introduced is 0.1 parts by mass or more, it is possible to avoid the problem of failing to provide an adhesion force sufficient to allow the sheet to be attached to the electronic device.

The introduction of an alkoxysilyl group can be confirmed by an IR spectrum of the modified hydrogenated block copolymer [E] into which the alkoxysilyl group has been introduced. The amount of the alkoxysilyl group introduced can be calculated from a 1H-NMR spectrum of the modified hydrogenated block copolymer [E] into which the alkoxysilyl group has been introduced.

[Method of Introducing Alkoxysilyl Group]

Methods of introducing an alkoxysilyl group into the hydrogenated block copolymer [D] are not particularly limited. Exemplary introduction methods include methods wherein the hydrogenated block copolymer [D] is reacted (grafted) with an ethylenically unsaturated silane compound in the presence of an organic peroxide, more specifically, wherein a mixture of the hydrogenated block copolymer [D], ethylenically unsaturated silane compound and organic peroxide in a molten state is kneaded in a twin-screw kneader for a desired time.

Ethylenically unsaturated silane compounds used in the introduction method described above are not limited to particular ones as long as they can undergo a grafting reaction with the hydrogenated block copolymer [D] to introduce an alkoxysilyl group into the hydrogenated block copolymer [D].

Suitable examples of ethylenically unsaturated silane compounds include vinyltrimethoxy silane, vinyltri ethoxysilane, allyltrimethoxysilane, allyltriethoxysilane, dimethoxymethylvinylsilane, diethoxymethylvinylsilane, p-styryltrimethoxy silane, 3-acryloxypropyltrimethoxy silane, 3-acryloxypropyltriethoxysilane, 3-methacryloxypropyltrimethoxysilane, 3-methacryloxypropyltriethoxy silane, 3-methacryloxypropylmethyldimethoxy silane, 3-methacryloxypropylmethyldiethoxysilane, and 3-acryloxypropyltrimethoxysilane. These ethylenically unsaturated silane compounds can be used singly or in combination.

Organic peroxides used for the grafting reaction are not limited to particular ones, but those having a half life temperature for 1 minute of 170° C. or higher and 190° C. or lower are preferred. Suitable examples of organic peroxides include t-butyl cumyl peroxide, dicumyl peroxide, di-t-hexyl peroxide, 2,5-dimethyl-2,5-di(t-butylperoxy) hexane, di-t-butyl peroxide, and 1,4-bis(2-t-butylperoxyisopropyl)benzene. These organic peroxides can be used singly or in combination.

The kneading temperature in a twin-screw kneader is not limited to a particular temperature but is preferably 180° C. or higher, more preferably 185° C. or higher, and particularly preferably 190° C. or higher, but preferably 220° C. or lower more preferably 210° C. or lower, and particularly preferably 200° C. or lower.

The heating and kneading time is not limited to a particular time but is preferably 0.1 minutes or more, more preferably 0.2 minutes or more, and particularly preferably 0.3 minutes or more, but preferably 10 minutes or less, more preferably 5 minutes or less, and particularly preferably 2 minutes or less.

By setting the heating and kneading temperature and the heating and kneading time (residence time) to fall within the respective preferred ranges described above, it is possible to efficiently carry out continuous kneading and extrusion.

The form of the obtained modified hydrogenated block copolymer (E) is not limited to a particular one but it is generally preferred that the modified hydrogenated block copolymer (E) is processed in pellet form for subsequent shaping and blending of additives.

The molecular weight of the modified hydrogenated block copolymer [E] does not substantially differ from the molecular weight of the hydrogenated block copolymer [D] from which it is made because the molecular weight of the alkoxysilyl group to be introduced is usually low.

However, because the hydrogenated block copolymer [D] is reacted (grafted) with an ethylenically unsaturated silane compound in the presence of an organic peroxide, cross-linking reactions and cleavage reactions of the polymer occur simultaneously, so that the value of the molecular weight distribution of the modified hydrogenated block copolymer [E] becomes high.

The molecular weight of the modified hydrogenated block copolymer [E] is not limited to a particular value, but from the viewpoint of heat resistance and mechanical strength of the soft layer, the molecular weight is preferably 35,000 or more, more preferably 38,000 or more, and particularly preferably 40,000 or more, but preferably 200,000 or less, more preferably 150,000 or less, and particularly preferably 100,000 or less, in terms of polystyrene equivalent weight average molecular weight (Mw) as measured by gel permeation chromatography (GPC) using tetrahydrofuran (THF) as solvent.

The molecular weight distribution (Mw/Mn) of the modified hydrogenated block copolymer [E] is not limited to a particular value, but from the viewpoint of heat resistance and mechanical strength of the soft layer, it is preferably 3.5 or less, more preferably 2.5 or less, and particularly preferably 2.0 or less.

<<<Glass Transition Temperature Tg, Melting Point>>>

From the viewpoint of resistance to the heat generated from the electronic device, the glass transition temperature Tg or melting point of the thermoplastic resin is preferably 90° C. or higher, more preferably 95° C. or higher, even more preferably 100° C. or higher, and particularly preferably 110° C. or higher, but preferably 160° C. or lower, more preferably 150° C. or lower, even more preferably 140° C. or lower, and particularly preferably 125° C. or lower from the viewpoint of heat resistance of the electronic device.

The "glass transition temperature Tg" can be calculated from the peak top temperature of loss tangent tan δ by, for example, measuring the dynamic viscoelastic property at a frequency of 1 Hz in the temperature range of −100° C. to +150° C. at a heating rate of 5° C./min using a viscoelasticity meter ("ARES" manufactured by T.A. Instrument Japan Co., Ltd.) based on the JIS-K7244-2 method.

The "melting point" can be measured for example by differential scanning calorimetry (DSC) based on JIS K7121.

<<Ultraviolet Absorber>>

By incorporating an ultraviolet absorber in at least one of the one or more soft layers, more UV light can be blocked.

Specific examples of ultraviolet absorbers include oxybenzophenone compounds, benzotriazole compounds, salicylic acid ester compounds, benzophenone compounds, and triazine compounds.

<<Other Additives>>

Examples of other additives to be added in at least one of the one or more soft layers include tackifiers, infrared absorbers, antioxidants, anti-blocking agents, and light stabilizers. These additives may be used alone or in combination.

Common methods known in the art can be used to blend additives into the soft layer. Examples include (i) a method wherein pellets of the soft layer and additives are uniformly mixed using a mixer such as a tumbler, a ribbon blender or Henschel type mixer, and then pelletized by melt-mixing and extruding the mixture using a continuous melt kneader such as a twin-screw extruder, and (ii) a method wherein the soft layer is pelletized by melt-kneading and extruding using a twin-screw extruder equipped with a side feeder while continuously adding various types of additives from the side feeder. By any of these methods, it is possible to produce a soft layer in which an additive is uniformly dispersed therein.

—Tackifier—

Blending of a tackifier provides tackiness and/or adhesiveness.

Specific examples of tackifiers include low molecular weight forms of polyisobutylene, polybutene, poly-1-octene, and ethylene/α-olefin copolymers, and hydrogenated forms thereof; and low molecular weight forms of polyisoprene and polyisoprene-butadiene copolymers, and hydrogenated forms thereof. These compounds may be used singly or in combination.

Preferred tackifiers are hydrogenated low molecular weight forms of polyisobutylene and hydrogenated low molecular weight forms of polyisoprene in terms of maintaining transparency and light resistance, as well as excellent filling property.

The amount of the tackifier added can be appropriately selected according to the required tackiness, but from the viewpoint of ease of handling of the soft layer, the amount of the tackifier is preferably 30 parts by mass or less, and more preferably 20 parts by mass or less, per 100 parts by mass of the soft layer.

—Infrared Absorber—

By blending an infrared absorber, infrared rays can be blocked.

Specific examples of infrared absorbers include fine particles of metal oxides such as tin oxide, aluminum doped tin oxide, indium doped tin oxide, antimony doped tin oxide, zinc oxide, aluminum doped zinc oxide, indium doped zinc oxide, gallium doped zinc oxide, tin doped zinc oxide, silicon doped zinc oxide, titanium oxide, niobium doped titanium oxide, tungsten oxide, sodium doped tungsten oxide, cesium doped tungsten oxide, thallium doped tungsten oxide, rubidium doped tungsten oxide, indium oxide, and tin doped indium oxide; and near infrared absorbing dyes such as phthalocyanine compounds, naphthalocyanine compounds, immonium compounds, diimonium compounds, polymethine compounds, diphenylmethane compounds, anthraquinone compounds, pentadiene compounds, azomethine compounds, and lanthanum hexaboride.

—Antioxidant—

By blending an antioxidant, processability and other properties can be improved.

Specific examples of antioxidant include phosphorus antioxidants, phenol antioxidants, and sulfur antioxidants.

—Anti-Blocking Agent—

By blending an anti-blocking agent, it is possible to prevent blocking of pellets containing the modified hydrogenated block copolymer (E) as a main component.

Specific examples of anti-blocking agents include lithium stearate, sodium stearate, potassium stearate, magnesium stearate, calcium stearate, aluminum stearate, zinc stearate, barium stearate, calcium laurate, zinc laurate, barium laurate, zinc myristate, calcium ricinoleate, zinc ricinoleate, barium ricinoleate, zinc behenate, sodium montanate, magnesium 12-hydroxystearate, calcium 12-hydroxystearate, and zinc 12-hydroxystearate.

—Light Stabilizer—

By blending a light stabilizer, durability can be increased.

Specific examples of light stabilizers include hindered amine light stabilizers.

As to the amounts of ultraviolet absorbers, infrared absorbers, antioxidants, anti-blocking agents and light stabilizers to be added, the total amount of these additives is preferably 0.001 parts by mass or more, more preferably 0.01 parts by mass or more, and particularly preferably 0.05 parts by mass or more, but preferably 5 parts by mass or less, more preferably 4 parts by mass or less, and particularly preferably 3 parts by mass or less, per 100 parts by mass of the soft layer.

The soft layer preferably has a total light transmittance and a specific range of spectral light transmittance at 385 nm wavelength or less in specific ranges. With this configuration, it is possible to increase the transparency and weather resistance of the laminate.

When the soft layer comprises two or more soft layers, at least one of the soft layers preferably has a total light transmittance and a spectral light transmittance at 385 nm wavelength or less in specific ranges. More preferably, all the soft layers have a total light transmittance and a spectral light transmittance at 385 nm wavelength or less in specific ranges.

<<Total Light Transmittance>>>

The total light transmittance of the at least one soft layer is preferably 85% or more, more preferably 88% or more, and particularly preferably 90% or more.

By setting the total light transmittance to 85% or more, transparency of the laminate can be improved.

"Total light transmittance" can be measured in accordance with JIS K7361 using a spectrophotometer (V-670, manufactured by JASCO Corporation).

<<Spectral Light Transmittance at 385 nm Wavelength or Less>>

The spectral light transmittance at 385 nm wavelength or less of the at least one soft layer is preferably 10% or less, more preferably 5% or less, and particularly preferably 1% or less.

When the spectral light transmittance at 385 nm wavelength or less is 10% or less, the weather resistance of the laminate can be improved.

"Spectral light transmittance at 385 nm wavelength or less" can be measured using a spectrophotometer (V-670, manufactured by JASCO Corporation).

<Electronic Device>

Specific examples of electronic devices include LED-mounted tapes, organic electroluminescence elements, liquid crystal elements, and printed boards. Electronic devices may or may not have a flexible substrate made of polycarbonate, polyethylene terephthalate, polyethylene naphthalate, alicyclic olefin polymer or other material.

(Method of Manufacturing Laminate)

The laminate is generally manufactured for example by laminating together resin sheets which serve as soft layers with an electronic device sandwiched between the resin sheets.

The disclosed method of manufacturing a laminate is a method of manufacturing the disclosed laminate described above and comprises the steps of: vacuum degassing a package in which a stack is sealed in a packaging bag; and making a laminate by heating and pressurizing the package subjected to the vacuum degassing.

<Vacuum Degassing Step>

The vacuum degassing step is a step of vacuum degassing a package in which a stack is sealed in a packaging bag.

<<Packaging Bag>>

The packaging bag is not limited to a particular one as long as its Vicat softening temperature and the melting temperature satisfy the specific relation described later. However, the packaging bag preferably comprises one or more layers made of polyethylene resin, and more preferably comprises a layer made of polyethylene resin as the innermost layer.

<<<Vicat Softening Temperature>>>

The Vicat softening temperature T3 is not limited to a particular value but is preferably 80° C. or higher, more preferably 85° C. or higher, and particularly preferably 90° C. or higher from the viewpoint of enclosure ability, but preferably 135° C. or lower, more preferably 120° C. or lower, and particularly preferably 110° C. or lower from the viewpoint of dimensional stability of the laminate to be manufactured.

"Vicat softening temperature" can be measured using a heat distortion tester (HDT) (manufactured Toyo Seiki Co., Ltd.) based on the HS K7206A method. In this measuring method, a test load of ION is applied to a plastic test piece, the temperature of a heat transfer medium is raised at a heating rate of 50° C./hour, and the temperature of the heat transfer medium at the time when a needle indenter penetrates 1 mm from the surface of the test piece is measured. Resin whose temperature has reached the "Vicat softening temperature" easily deforms. In other words, when the temperature of the packaging bag reaches the Vicat softening temperature, the stress of the packaging bag associated with deformation such as thermal shrinkage or elongation becomes extremely small.

When the packaging bag comprises two or more layers, the Vicat softening temperature of the packaging bag means the Vicat softening temperature of the material of the innermost layer of the packaging bag.

<<<Melting Temperature>>>

The melting temperature T4 is not limited to a particular value but is preferably 150° C. or lower, more preferably 140° C. or lower, and particularly preferably 135° C. or lower from the viewpoint of the heat-resistant temperature of the electronic device.

"Melting temperature" can be measured using a differential scanning calorimeter (DSC) (DSC6200, manufactured by Hitachi High Technology Science Co., Ltd.) with the melt point peak taken as the melting temperature. Resin whose temperature has reached the melting temperature becomes liquid, so that the shape of the packaging bag cannot be maintained. Thus, the state of the packaging bag that has reached the melting temperature is clearly different from the state of the packaging bag that has reached the Vicat softening temperature and retains its shape.

When the packaging bag comprises two or more layers, the melting temperature of the packaging bag means the melting temperature of the material of the innermost layer of the packaging bag.

<<<Polyethylene Resin>>>

Examples of polyethylene resins include high-density polyethylene resin, medium-density polyethylene resin, low-density polyethylene resin, linear low-density polyethylene resin, linear low-density polyethylene resin having a long chain branch, and mixtures thereof.

<Heating and Pressurizing Step>

The heating and pressurizing step is a step of making a laminate by heating and pressurizing the package subjected to vacuum degassing. Preferably, heating and pressurizing are autoclave treatment performed in an autoclave device.

When the heating temperature is defined as T1, the glass transition temperature or melting point of two or more soft layers as T2, the Vicat softening temperature of the packaging bag as T3, and the melting temperature of the packaging bag as T4, T1, T2, T3 and T4 satisfy the relation of T4>T1≥T2≥T3

In other words, for example, by making a packaging bag a using polyethylene film having a Vicat softening temperature (T3) of 95° C. and a melting temperature (T4) of 130° C., using a soft layer having a glass transition temperature Tg (T2) of 105° C. and performing lamination in an autoclave at a heating temperature (T1) of 110° C., a vacuum is maintained because the temperature is lower than 95° C., which is the Vicat softening temperature (T3) of the packaging bag, during the temperature rise. When the lamination temperature (heating temperature (T1) 110° C.) is reached, a temperature higher than 95° C. which is the Vicat softening temperature (T3) of the packaging bag, a stress is not strongly applied to the ends of the soft layer. Further, since the lamination temperature (heating temperature (T1) 110° C.) is lower than 130° C. which is the melting temperature (T4) of the packaging bag and is higher than 105° C. which is the glass transition temperature Tg(T2) of the soft layer, the packaging bag is not melted off, and lamination is favorably completed.

The heating temperature T1 is not limited to a particular value, but from the viewpoint of enclosure ability, it is preferably higher than 100° C., more preferably 105° C. or higher, even more preferably 110° C. or higher, and particularly preferably 115° C. or higher, but preferably lower than 150° C., more preferably 140° C. or lower, even more preferably 135° C. or lower, and particularly preferably 128° C. or lower.

The pressure at the time of pressurization in the heat and pressurizing step is not limited to a particular value but is preferably 0.2 MPa or more, and preferably 0.8 MPa or less

EXAMPLES

The following provides a more specific description of the present disclosure based on Examples. However, the present disclosure is not limited to the following Examples. In the following description, "%" and "parts" used in expressing quantities are by mass, unless otherwise specified." Measurements and Evaluations in Examples were performed by the methods described below.

(1) Weight-Average Molecular Weight (Mw) and Molecular Weight Distribution (Mw/Mn)

Standard polystyrene equivalent molecular weights of the block copolymer [C] and hydrogenated block copolymer [D] were measured at 40° C. using tetrahydrofuran (THF) as eluant. A gel-permeation chromatography (GPC) device (HLC8320GPC, manufactured by Tosoh Corporation Co.) was used for the measurement.

(2) Percent Hydrogenation

The percent hydrogenations of the main chain, side chain and aromatic ring of the hydrogenated block copolymer [D] were calculated by 1H-NMR of the block copolymer [C] and hydrogenated block copolymer [D].

(3) Ratio of wA to wB (wA:wB)

As to the ratio of wA to wB (wA:wB) where wA is the mass fraction of all the polymer blocks [A] in the block copolymer [C] and wB is the mass fraction of all the polymer blocks [B] in the block copolymer [C], in the process of producing the block copolymer [C], the mass fraction of each polymer block was calculated based on the numbers of parts of the aromatic vinyl compound, the chain conjugated diene compound and other vinyl compound used for the polymerization of each polymer block and on the polymerization conversion rate of monomer into polymer at the end of each polymer block polymerization as measured by gas chromatography (GC).

(4) Flexural Modulus

A modified hydrogenated block copolymer [E1], a soft resin composition [F2] or a resin composition [E2] to be described later, each of which is the material of soft sheet [S]

as the soft layer, was subjected to injection molding to produce a test piece having a length of 80 mm, a width of 10 mm and a thickness of 4 mm. Flexural test of the test piece was performed in accordance with JIS K 7171 to measure the flexural modulus.

(5) Water Vapor Permeability

A modified hydrogenated block copolymer [E1], a soft resin composition [F2] or a resin composition [E2] to be described later, each of which is the material of soft sheet [S] as the soft layer, was subjected to injection molding to produce a test piece having a thickness of 300 μm to 350 μm, and water vapor permeability of the test piece was measured at 40° C. and 90% RH in accordance with the JIS Z0208 method. In order to clarify the characteristics of the sheet material, the measured values were converted to values for a sheet thickness of 100 μm for comparison.

Water vapor (moisture) permeability of the soft sheet [S] was measured at 40° C. and 90% RH using a water vapor permeation tester (LYSSY L80-5000) based on JIS K7129 (method A).

(6) Total Light Transmittance

The total light transmittance of the soft sheet [S] as a soft layer was measured according to the JIS K7361 using spectrophotometer (V-670, manufactured by JASCO Corporation).

The soft sheet [S] was sandwiched between two polyethylene terephthalate (hereinafter "PET") release films and subjected to heating and pressurizing treatment at 150° C. for 10 minutes using a vacuum laminator (PVL0202S, manufactured by Nisshinbo Mechatronics Inc.). Total light transmittance of the resulting sheet was measured.

(7) Light Transmittance at 385 nm Wavelength

Light transmittance at 385 nm wavelength of the soft sheet [S] as a soft layer was measured using a spectrophotometer (V-670, manufactured by JASCO Corporation).

The soft sheet [S] was sandwiched between two PET release films and subjected to heating and pressurizing treatment at 150° C. for 10 minutes using a vacuum laminator (PVL0202S, manufactured by Nisshinbo Mechatronics Inc.). Light transmittance at 385 nm wavelength of the resulting sheet was measured.

(8) Manufacture of Flexible Laminate

As an electronic device, a LED-mounted tape (L) was used in which high luminous SMD3528 LED chips having a thickness of 3 mm and a width of 8 mm are mounted on a polyimide substrate having a thickness of 25 μm, a width of 10 mm and a length of 30 cm.

A vacuum package was obtained by placing a stack which comprises, in order, one or more soft sheets [S]/LED-mounted tape [L]/one or more soft sheets [S] in a packaging bag having a predetermined configuration and performing vacuum packaging using a small vacuum packager ("T-100" manufactured by Nippon Hoso-Kikai Co., Ltd.).

The obtained vacuum package was taken out and was pressurized and heated at a holding temperature of 110° C. at a holding pressure of 0.3 MPa for a retention time of 20 minutes and at a take-out temperature of 40° C. using a small-sized autoclave ("DANDELION" manufactured by Hanyuda Co., Ltd.) to produce a laminate [Z] in which the electronic device was enclosed by the soft layer.

(9) Dimensional Stability of Flexible Laminate (Dimensional Stability in Initial Evaluation of Laminate)

The thicknesses of the end portion and central portion of the laminate [Z] produced in the above (8) were measured and dimensional stability was evaluated based on the following criteria.

<Evaluation Criteria>

Good: The value obtained by the following Equation (1) is 0.1 or less.

Allowable: The value of the following Equation (1) is greater than 0.1 and 0.2 or less Poor: The value obtained by the following Equation (1) is greater than 0.2

$$2\times|\text{Thickness of End Portion}-\text{Thickness of Central Portion}|/(\text{Thickness of End Portion}+\text{Thickness of Central Portion}) \quad \text{Equation (1)}$$

(10) Ability of Flexible Laminate to Enclose Electronic Device ("Enclosure Ability" in Initial Evaluation of Laminate)

The laminate [Z] produced in the above (8) was visually observed and the ability of enclosing an electronic device was evaluated according to the following criteria.

<Evaluation Criteria>

Good: No interface gap between electronic device and soft layer

Poor: Interface gap between electronic device and soft layer

(11) Lighting Test of Flexible Laminate ("Lighting Test" of Initial Evaluation of Laminate)

The laminate [Z] produced in the above (8) was subjected to a lighting test and evaluated according to the following criteria.

<Evaluation Criteria>

Good: All of the LED elements in the electronic device were lit up.

Poor: Even one LED element in the electronic device was not lit up

(12) Flexibility Test of Flexible Laminate

After the laminate [Z] produced in the above (8) was bent along a concrete cylinder having a diameter of 150 mm, visual inspection and lighting test were performed and the results were evaluated based on the following criteria.

<Evaluation Criteria (Visual Inspection)>

Good: No appearance change of the laminate [Z] observed, such as the appearance of cracks.

Poor: Appearance change of the laminate [Z] observed, such as the appearance of cracks.

<Evaluation Criteria (Lighting Test)>

Good: All of the LED elements in the electronic device were lit up

Poor: Even one LED element in the electronic device was not lit up

(13) Moisture Resistance Test of Flexible Laminate

After the laminate [Z] produced in the above (8) was submerged in water at 40° C. for 100 hours, a lighting test was performed and the results were evaluated on the criteria described below.

<Evaluation Criteria>

Good: All of the LEDs in the electronic device were lit up.

Poor: Even one LED element in the electronic device was not lit up

(14) Weather Resistance Test of Flexible Laminate

The visible side surface of the laminate [Z] produced in the above (8) was irradiated with light at a luminance of 60 W/m$^2$ and a black panel temperature of 63° C. for 300 hours using a xenon lamp (X75SC, manufactured by Suga Test Instruments Co., Ltd.).

After the irradiation, the light irradiation surface of the laminate [Z] was slowly bent so that the radius of curvature R became 75 mm, and the laminate [Z] was visually inspected for defects such as cracks. The operation from light irradiation to visual inspection for defects was performed for a total of 10 cycles, and the results were evaluated on the criteria described below.

<Evaluation Criteria>
  Good: No defects observed
  Acceptable: Defects generated within 5 cycles.
  Poor: Defects generated within 4 cycles Production Example 1

<Production of Soft Sheet [S1]>

400 parts of dehydrated cyclohexane, 10 parts of dehydrated styrene, and 0.475 parts of dibutyl ether were charged into a reactor equipped with a stirrer and sufficiently purged with nitrogen. While stirring the whole at 60° C., 0.91 parts of n-butyllithium (15% cyclohexane solution) was added to initiate polymerization. Subsequently, 15 parts of dehydrated styrene was continuously added into the reactor for 40 minutes while stirring the whole at 60° C. to proceed the polymerization reaction, and after completion of the addition, the whole was further stirred at 60° C. for 20 minutes. The polymerization conversion rate at this point was 99.5% as determined by gas chromatography (GC).

Next, 50 parts of dehydrated isoprene was continuously added to the reaction solution over 130 minutes, and after the addition was completed, stirring was continued for 30 minutes. At this point, the reaction solution was analyzed by GC and the polymerization conversion rate was found to be 99.5%.

Thereafter, 25 parts of dehydrated styrene was continuously added to the reaction solution over 70 minutes, and the mixture was stirred as it was for 60 minutes after completion of the addition. At this point, the reaction solution was analyzed by GC and the polymerization conversion rate was found to be almost 100%.

0.5 parts of isopropyl alcohol was added to the reaction solution to quench the reaction to afford a polymer solution. The block copolymer [C1] contained in the polymer solution was a triblock copolymer of [A]-[B]-[A] type, having a weight-average molecular weight (Mw) of 45,200, a molecular weight distribution (Mw/Mn) of 1.03, and a wA:wB ratio of 50:50.

Next, the polymer solution was transferred to a pressure-resistant reactor equipped with a stirring device. As a hydrogenation catalyst, 4.0 parts of nickel catalyst supported on diatomaceous earth ("E22U", nickel loading amount of 60%, manufactured by JGC Catalysts and Chemicals Ltd.) and 100 parts of dehydrated cyclohexane were added and mixed. With the reactor purged with hydrogen gas and fed with hydrogen gas while stirring the solution, a hydrogenation reaction was performed at 190° C. and 4.5 MPa for 6 hours.

The hydrogenated block copolymer [D1] contained in the reaction solution obtained by the hydrogenation reaction had a weight-average molecular weight (Mw) of 47,800 and a molecular weight distribution (Mw/Mn) of 1.04.

After completing the hydrogenation reaction, the reaction solution was filtered to remove the hydrogenation catalyst, and 2.0 parts of a xylene solution containing 0.1 parts of pentaeratritol-tetrakis[3-(3,5-di-t-butyl-4-hydrifenyl)propionate ("AO60" manufactured by ADEKA) as a phenol antioxidant was added for dissolution.

Next, cyclohexane, xylene and other volatile components were removed from the solution at a temperature of 260° C. and a pressure of 0.001 MPa or less using a cylindrical concentration dryer ("Kontoro", manufactured by Hitachi, Ltd.). The molten polymer was extruded from a die into strands, cooled, and cut with a pelletizer to afford 94 parts of pellets composed of the hydrogenated block copolymer [D1].

The resulting hydrogenated block copolymer [D1] in pellet form had a weight-average molecular weight (Mw) of 47,600, a molecular weight distribution (Mw/Mn) of 1.04, and a percent hydrogenation of almost 100% for both "main chain and side chain" and "aromatic".

To 100 parts of the pellets of the obtained hydrogenated block copolymer [D1] were added 2.0 parts of vinyltrimethoxysilane and 0.2 parts of 2,5-dimethyl-2,5-di(t-butylperoxy)hexane ("PERHEXA® 25B" (PERHEXA is a registered trademark in Japan, foreign countries, or both), manufactured by NOF Corporation). The mixture was kneaded using a twin-screw extruder ("TEM37B", manufactured by Toshiba Machine Co., Ltd.) at resin temperature of 200° C. for a residence time of 60 to 70 seconds. The obtained kneaded product was extruded into strands, air-cooled, and cut by a pelletizer to afford 97 parts of pellets of a modified hydrogenated block copolymer [E1] having an alkoxysilyl group.

After dissolving 10 parts of the pellets of the modified hydrogenated block copolymer [E1] in 100 parts of cyclohexane, the obtained solution was poured into 400 parts of dehydrated methanol to coagulate the modified hydrogenated block copolymer [E1]. The coagulated product was dried under vacuum at 25° C. to afford 9.0 parts of the purified modified hydrogenated block copolymer [E1].

Measurement of an FT-IR spectrum of the modified hydrogenated block copolymer [E1] revealed the presence of a new absorption band derived from Si—OCH$_3$ group at 1,090 cm$^{-1}$ and new absorption bands derived from Si—CH$_2$ group at 825 cm$^{-1}$ and 739 cm$^{-1}$, which are different from the positions of the absorption bands derived from Si—OCH$_3$ group and Si—CH group of vinyltrimethoxysilane (1,075 cm$^{-1}$ for Si—OCH$_3$ group, and 808 cm$^{-1}$ and 766 cm$^{-1}$ for Si—CH group).

A $^1$H-NMR spectrum in deuterochloroform of the modified hydrogenated block copolymer [E1] was measured, and a peak based on the proton of the methoxy group was observed at 3.6 ppm. From the peak area ratio, it was confirmed that 1.9 parts of vinyltrimethoxysilane was bound to 100 parts of the hydrogenated block copolymer [D1]. The glass transition temperature T2 of the modified hydrogenated block copolymer [E1] was 121° C.

To 100 parts of the pellets of the modified hydrogenated block copolymer [E1] obtained above was 0.2 parts of (2-(5-chloro-2H-benzotriazole-2-yl)-6-tert-butyl-p-cresol ("SUMISORB® 300" (SUMISORB is a registered trademark in Japan, foreign countries, or both) manufactured by Sumitomo Chemical Corporation) as an ultraviolet absorber and mixed uniformly. Using a T-die film melt extruder (T-die width: 400 mm) having a twin-screw kneader (TEM37B, manufactured by Toshiba Machine Co., Ltd.) equipped with screws having diameters of 37 mm, a casting roll (with embossed pattern), and an extrusion sheet molding machine equipped with a sheet drawing device, this mixture was extruded at molten resin temperature of 200° C., a T-die temperature of 200° C., and a casting roll temperature of 60° C. to afford a soft sheet [S1] (thickness: 760 μm) which comprises as a main component the modified hydrogenated block copolymer [E1]).

The embossed pattern was transferred to the soft sheet [S1] by pressing one side of the extruded sheet against the embossing roll with a nip roll. The obtained soft sheet [S1] was collected on a roller.

Production Example 2

<Production of Soft sheet [S2]>

To 100 parts of pellets of the modified hydrogenated block copolymer [E1] obtained in Production Example 1 was added 0.2 parts of (2-(5-chloro-2H-benzotriazole-2-yl)-6-tert-butyl-p-cresol ("SUMISORB® 300" (SUMISORB is a registered trademark in Japan, foreign countries, or both) manufactured by Sumitomo Chemical Corporation) as an ultraviolet absorber and mixed uniformly. The mixture (liquid) was extruded at 190° C. resin temperature using a twin-screw extruder (TEIVI37BS, manufactured by "Toshiba Machine Co., Ltd.") equipped with a side feeder to which the mixture (liquid) could be added. On the other hand, hydrogenated isobutene polymer ("Nippon Oil Polybutene SH10", manufactured by NOF Corporation) as a tackifier was continuously added from the side feeder such that 10 parts of the tackifier was added per 100 parts of modified hydrogenated block copolymer [E1]. The mixture was extruded in strands, air-cooled, and then cut by a pelletizer to afford 104 parts of pellets of a soft resin composition [F2] which comprises the modified hydrogenated block copolymer [E1] as a main component. The glass transition temperature T2 of the soft resin composition [F2] was 110° C.

Except for the use of the pellets of the soft resin composition [F2], extrusion molding was performed using the same extrusion sheet molding machine as in Production Example 1 at a molten resin temperature of 170° C., a T die temperature of 170° C., and a cast roll temperature of 50° C. to afford a soft sheet [S2] (760 μm in thickness and 330 mm in width) which comprises the modified hydrogenated block copolymer [E1] as a main component.

Production Example 3

<Manufacture of Soft Sheet [S3]>

Pellets of ethylene-vinyl acetate copolymer (Evaflex® EV250 (Evaflex is a registered trademark in Japan, foreign countries, or both), manufactured by Dow-Mitsui Polychemicals Co., Ltd., vinyl acetate content: 28%, melting point: 72° C.) were used, and 0.1 parts of 2,5-dimethyl-2,5-di(t-butylperoxy)hexane ("PERHEXA® 25B" (PERHEXA is a registered trademark in Japan, foreign countries, or both), manufactured by NOF Corporation) as an organic peroxide and 0.5 part of triallyl isocyanurate (M-60, manufactured by Nippon Kayaku Co., Ltd.) as a crosslinking aid were added. Using a twin-screw kneader, the mixture was kneaded at resin temperature of 100° C., extruded into strands, air-cooled, and then cut with a pelletizer to afford 94 parts of resin composition [E2]. The melting point T2 of the resin composition [E2] was 71° C.

The pellets of resin composition [E2] were extruded using the same extrusion sheet molding machine as in Production Example 1 at a molten resin temperature 100° C. a T-die temperature 100° C., and a cast roll temperature 25° C. to afford a soft sheet [S3] (760 μm in thickness and 330 mm in which) which comprises the resin composition [E2] as a main component.

Production Example 4

<Production of Soft Sheet [S4]>

The modified hydrogenated block copolymer [E1] obtained in Production Example 1 was extruded using the same extrusion sheet molding machine as in Production Example 1 at a molten resin temperature of 200° C. a T die temperature of 200° C., and a cast roll temperature of 60° C. to afford a soft sheet [S4] (760 μm in thickness) which comprises the modified hydrogenated block copolymer [E1] as a main component.

The embossed pattern was transferred to the soft sheet [S4] by pressing one side of the extruded sheet against the embossing roll with a nip roll. The obtained soft sheet [S4] was collected on a roller.

Example 1

The water vapor permeability, total light transmittance, and light transmittance at 385 nm wavelength of the soft sheet [S1] obtained in Production Example 1 were measured. In addition, a test piece for flexural modulus measurement was made and measurement of flexural modulus was performed. The measurement results are shown in Table 1.

Next, flexible layer 1: three soft sheets [S1])/LED-mounted tape [L]/flexible layer 2: one soft sheet [S4] were sequentially stacked and this stack was placed in a packaging bag [P-1]. The packaging bag [P-1] was made by cutting a 60 μm-thick linear low density polyethylene film ("LL-XHT", manufactured by Nimura Chemical Co., Ltd., Vicat softening temperature T3: 95° C., melting temperature T4: 130° C.) into 300 mm×300 mm size and sealing the cut film on three sides at a seal width of 10 mm using an impulse sealer. The "soft layer" in the present Example is a soft sheet that comes in contact with an electronic device composed of the LED mounted tape [L] and of the flexible layer 2.

Thereafter, the sealed stack (package) was placed into an autoclave apparatus, and heated and pressurized at a heating temperature (T1) of 123° C. and a pressure of 0.8 MPa for 30 minutes to produce a laminate [Z1] wherein an electronic device is enclosed by soft sheets.

The obtained laminate [Z1] was subjected to dimensional stability evaluation, electronic device enclosure ability evaluation, lighting test, flexibility test, moisture resistance test, and weather resistance test. The results are indicated below and in Table 1.

All the evaluation results were "Good".

Example 2

A laminate [Z2] in which an electronic device is enclosed by soft sheets was produced as in Example 1 except that the conditions in the autoclave apparatus were changed to a heating temperature (T1) of 128° C. and a pressure of 0.2 MPa.

The obtained laminate [Z2] was subjected to dimensional stability evaluation, electronic device enclosure ability evaluation, lighting test, flexibility test, moisture resistance test, and weather resistance test. The results are indicated below and in Table 1.

All the evaluation results were "Good".

Example 3

The water vapor permeability, total light transmittance, and light transmittance at 385 nm wavelength of the soft sheet [S2] obtained in Production Example 2 were measured. In addition, a test piece for flexural modulus measurement was made and measurement of flexural modulus was performed. The measurement results are shown in Table 1.

Next, flexible layer 1: three soft sheets [S2])/LED-mounted tape [L]/flexible layer 2: one soft sheet [S2] were sequentially stacked and this stack was placed in the packaging bag [P-1] used in Example 1.

Thereafter, the sealed stack (package) was put into an autoclave apparatus, and heated and pressurized at a heating temperature (T1) of 115° C. and a pressure of 0.8 MPa for 30 minutes to produce a laminate [Z3] wherein an electronic device is enclosed by soft sheets.

The obtained laminate [Z3] was subjected to dimensional stability evaluation, electronic device enclosure ability evaluation, lighting test, flexibility test, moisture resistance test, and weather resistance test. The results are indicated below and in Table 1.

All the evaluation results were "Good".

Example 4

The water vapor permeability, total light transmittance, and light transmittance at 385 nm wavelength of the soft sheet [S4] obtained in Production 4 were measured. In addition, a test piece for flexural modulus measurement was made and measurement of flexural modulus was performed. The measurement results are shown in Table 1.

Next, flexible layer 1: three soft sheets [S4]/LED-mounted tape [L]/flexible layer 2: one soft sheet [S4] were sequentially stacked and this stack was placed in the packaging bag [P-1] used in Example 1.

Thereafter, the sealed stack (package) was put into an autoclave apparatus, and heated and pressurized at a heating temperature (T1) of 125° C. and a pressure of 0.4 MPa for 30 minutes to produce a laminate [Z4] wherein an electronic device is enclosed by soft sheets.

The obtained laminate [Z4] was subjected to dimensional stability evaluation, electronic device enclosure ability evaluation, lighting test, flexibility test, moisture resistance test, and weather resistance test. The results are indicated below and in Table 1.

The results of dimensional stability evaluation, electronic device enclosure ability evaluation, lighting test, flexibility test, and moisture resistance test were "Good" but weather resistance test was "Acceptable" with slight defects generated at the fifth cycle.

Comparative Example 1

The water vapor permeability, total light transmittance, and light transmittance at wavelength 385 nm of the soft sheet [S3] obtained in Production Example 3 were measured. In addition, a test piece for flexural modulus measurement was made and measurement of flexural modulus was performed. The measurement results are shown in Table 1.

Next, flexible layer 1: two soft sheets [S3]/LED-mounted tape [L]/flexible layer 2: one soft sheet [S3] were sequentially stacked and this stack was placed in the packaging bag [P-1] used in Example 1.

Thereafter, the sealed stack (package) was put into an autoclave apparatus, and heated and pressurized at a heating temperature (T1) of 115° C. and a pressure of 0.8 MPa for 30 minutes to produce a laminate [Z5] wherein an electronic device is enclosed by soft sheets.

The obtained laminate [Z5] was subjected to dimensional stability evaluation, electronic device enclosure ability evaluation, lighting test, flexibility test, and moisture resistance test. No weather resistance test was performed. The results are indicated below and in Table 1.

The results of electronic device enclosure ability evaluation, lighting test, and flexibility test were "Good" but dimensional stability was "Poor" and also the moisture resistance test was "Poor" because not all the LED elements were lit up.

Example 5

A laminate [Z6] was produced as in Example 1 except that the packaging bag used to produce the laminate was changed to a packaging bag [P-2] made by cutting a 60 μm-thick cast polypropylene film (TORAYFAN "ZK100" manufactured by Toray Advanced Film Co., Ltd., Vicat softening temperature T3: 150° C., melting temperature T4: 165° C.) into 300 mm×300 mm size and sealing the cut film on three sides at a seal width of 10 mm using an impulse sealer.

The obtained laminate [Z6] was subjected to dimensional stability evaluation, electronic device enclosure ability evaluation, lighting test, flexibility test, and moisture resistance test. No weather resistance test was performed. The results are indicated below and in Table 1.

The results of electronic device enclosure ability evaluation, lighting test, flexibility test, and moisture resistance test were "Good" but dimensional stability was "Acceptable."

TABLE 1

|  |  | Ex. 1 | Ex. 2 | Ex. 3 | Ex. 4 | Comp. Ex. 1 | Ex. 5 |
|---|---|---|---|---|---|---|---|
| Flexible layer 1 | Configuration | Three [S1] sheets | Three [S1] sheets | Three [S2] sheets | Three [S4] sheets | Two [S3] sheets | Three [S1] sheets |
|  | Glass transition temperature Tg (T2) (° C.) | 121 | 121 | 110 | 121 | 71 (melting point) | 121 |
|  | Ultraviolet absorber (UVA) | Blended | Blended | Blended | Not blended | Not blended | Blended |
|  | Water vapor permeability [g/m$^2$ · 24 h] · 100 μm] | 11 | 11 | 12 | 11 | 100 | 11 |
|  | Flexural modulus (MPa) | 600 | 600 | 240 | 600 | 15 | 600 |
|  | Total light transmittance (%) | ≥85 | ≥85 | ≥85 | ≥85 | ≥85 | ≥85 |
|  | Light transmittance at 385 nm wavelength (%) | ≤1 | ≤1 | ≤1 | ≤1 | ≤1 | ≤1 |
|  | Electronic device | LED tape | LED tape | LED tape | LED tape | LED tape | LED tape |

TABLE 1-continued

|  |  | Ex. 1 | Ex. 2 | Ex. 3 | Ex. 4 | Comp. Ex. 1 | Ex. 5 |
|---|---|---|---|---|---|---|---|
| Flexible layer 2 | Configuration | One [S4] sheet | One [S4] sheet | One [S2] sheet | One [S4] sheet | One [S3] sheet | One [S4] sheet |
|  | Glass transition temperature Tg (T2) (° C.) | 121 | 121 | 110 | 121 | 71 (melting point) | 121 |
|  | Ultraviolet absoiber (UVA) | Not blended | Not blended | Blended | Not blended | Not blended | Not blended |
|  | Water vapor permeability [g/(m² · 24 h) · 100 μm] | 11 | 11 | 12 | 11 | 100 | 11 |
|  | Flexural modulus (MPa) | 600 | 600 | 240 | 600 | 15 | 600 |
|  | Total light transmittance (%) | ≥85 | ≥85 | ≥85 | ≥85 | ≥85 | ≥85 |
|  | Light transmittance at 385 nm wavelength (%) | ≤1 | ≤1 | ≤1 | ≤1 | ≤1 | ≤1 |
| Packaging bag | Material | PE | PE | PE | PE | PE | PP |
|  | Vicat temperature T3(° C.) | 95 | 95 | 95 | 95 | 95 | 150 |
|  | Melting temperature T4(° C.) | 130 | 130 | 130 | 130 | 130 | 165 |
| Manufacturing condition | Heating temperature T1(° C.) | 123 | 128 | 115 | 125 | 115 | 120 |
|  | Pressure (MPa) | 0.8 | 0.2 | 0.8 | 0.4 | 0.8 | 0.8 |
| Initial evaluation of laminate | Dimensional stability | Good | Good | Good | Good | Poor | Acceptable |
|  | Enclosure ability | Good | Good | Good | Good | Good | Good |
|  | Lighting test | Good | Good | Good | Good | Good | Good |
| Flexibility test | Visual inspection evaluation | Good | Good | Good | Good | Good | Good |
|  | Lighting test | Good | Good | Good | Good | Good | Good |
| Moisture resistance test |  | Good | Good | Good | Good | Poor | Good |
| Weather resistance test |  | Good | Good | Good | Acceptable | — | — |

As seen from Table 1, the laminates of Examples 1 to 5 which comprise soft sheets having a specific flexural modulus and a specific water vapor permeability and an electronic device enclosed by the soft layers had better flexibility and moisture resistance as well as better dimensional stability compared to the laminate of Comparative Example 1 which does not comprise a soft sheet having a specific flexural modulus and a specific water vapor permeability.

Also, it can be seen from Table 1 that the laminates of Example 1 to 3 in which an ultraviolet absorber was blended to control the light transmittance of the soft sheets had excellent weather resistance.

INDUSTRIAL APPLICABILITY

According to the disclosed laminate, it is possible to increase flexibility and moisture resistance.

According to the disclosed method of manufacturing a laminate, it is possible to manufacture a laminate having an electronic device, which is excellent in flexibility and moisture resistance.

REFERENCE SIGNS LIST

1 Laminate
2a Soft layer
2b Soft layer
2c Soft layer
2d Soft layer
3 Electronic device
4 Lead-out wire

The invention claimed is:

1. A laminate comprising a first soft layer, a second soft layer, a third soft layer, a fourth soft layer, and an electronic device enclosed by the first to fourth soft layers,
wherein the first to fourth soft layers each directly contact the electronic device,
the first soft layer is positioned on one side of the electronic device,
the second soft layer is positioned on the other side of the electronic device,
the first and second soft layers are different soft layers and each comprise a thermoplastic resin,
the thermoplastic resin comprises as a main component a modified hydrogenated block copolymer [E] in which an alkoxysilyl group is introduced to a hydrogenated block copolymer [D], the hydrogenated block copolymer [D] being obtained by hydrogenating a block copolymer [C] which comprises: a polymer block [A] which comprises as a main component a structural unit derived from an aromatic vinyl compound; and a polymer block [B] which comprises as a main component a structural unit derived from a chain conjugated diene compound, and
wherein the first to fourth soft layers have a flexural modulus of 80 MPa or more and 1,000 MPa or less and a water vapor permeability at 40° C. and 90% RH of 15 [g/(m²·24h)·100 μm] or less.

2. The laminate of claim 1, wherein the thermoplastic resin has a glass transition temperature or melting point of 90° C. or higher.

3. The laminate of claim 1, wherein the hydrogenated block copolymer [D] is obtained by hydrogenating 90% or more of carbon-carbon unsaturated bonds of main chains and side chains and 90% or more of carbon-carbon unsaturated bonds of aromatic rings in the block copolymer [C].

4. The laminate of claim 1, wherein at least one of the first to fourth soft layers comprises an ultraviolet absorber.

5. The laminate of claim 1, wherein at least one of the first to fourth soft layers has a total light transmittance of 85% or more and a spectral light transmittance at 385 nm wavelength or less of 1% or less.

6. The laminate of claim 1, wherein the first soft layer and the second soft layer are different in at least one of thickness, material, or color.

7. The laminate of claim 1, wherein the first soft layer comprises an ultraviolet absorber, and the second soft layer does not comprise an ultraviolet absorber.

8. A method of manufacturing the laminate of claim 1, comprising:
  vacuum degassing a package in which a stack in which the electronic device is enclosed by the first to fourth soft layers is sealed in a packaging bag; and
  making the laminate by heating and pressurizing the package subjected to the vacuum degassing,
  wherein a relation of $T4 > T1 \geq T2 \geq T3$ is satisfied, where T1 is a temperature of the heating, T2 is a glass transition temperature or melting point of the first to fourth soft layers, T3 is a Vicat softening temperature of the packaging bag, and T4 is a melting temperature of the packaging bag.

9. The method of manufacturing a laminate of claim 8, wherein the packaging bag comprises one or more layers made of polyethylene resin.

\* \* \* \* \*